United States Patent

Ngo

[11] Patent Number: 6,051,870
[45] Date of Patent: Apr. 18, 2000

[54] PROCESS FOR FABRICATING SEMICONDUCTOR DEVICE INCLUDING IMPROVED PHOSPHOROUS-DOPED SILICON DIOXIDE DIELECTRIC FILM

[75] Inventor: Minh Van Ngo, Union City, Calif.

[73] Assignee: Advanced Micro Devices, Sunnyvale, Calif.

[21] Appl. No.: 08/992,333

[22] Filed: Dec. 17, 1997

[51] Int. Cl.[7] .................................................. H01L 29/00
[52] U.S. Cl. ............................................................. 257/519
[58] Field of Search ............................................. 257/519

[56] References Cited

U.S. PATENT DOCUMENTS 5,729,043  3/1998  Shepard.

OTHER PUBLICATIONS

Wolf, *Silicon Processing for VLSI Era vol. 2*, pp. 196–197, 1990.

*Primary Examiner*—Stephen D. Meier
*Attorney, Agent, or Firm*—David G. Alexander; Arter & Hadden LLP

[57] ABSTRACT

A semiconductor structure includes a substrate, a microelectronic device formed on the substrate, and a dielectric layer including silicon dioxide formed over the microelectronic device. The silicon dioxide layer is doped with phosphorous in the form of approximately 96% $SiO_2$ and 4% phosphorous ($PH_3$) by weight, and has high etch selectivity, polish rate and gettering capability as well as excellent step coverage. The present process also improves uniformity and process control because phosphine is a gas and does not have to be vaporized prior to deposition.

16 Claims, 4 Drawing Sheets

PROCESS FOR FABRICATING SEMICONDUCTOR DEVICE INCLUDING IMPROVED PHOSPHOROUS-DOPED SILICON DIOXIDE DIELECTRIC FILM

BACKGROUND OF THE INVENTION

1. Field of the Invention

The present invention generally relates to the art of microelectronic integrated circuits, and more specifically to a process for fabricating a semiconductor device including an improved phosphorous-doped silicon dioxide dielectric layer.

2. Description of the Related Art

Microelectronic integrated circuit chips typically include a number of semiconductor and metal interconnect layers which must be electrically insulated from each other by dielectric layers. The surfaces of such chips are also typically encapsulated by protective dielectric passivation layers.

Tetraethylorthosilicate (TEOS) is a material which can be advantageously reacted with oxygen to form a silicon dioxide ($SiO_2$) dielectric layer for these purposes. TEOS can be used to form silicon dioxide layers using Plasma Enhanced Chemical Vapor Deposition (PECVD) technique at a relatively low temperature on the order of 400° C.

Silicon dioxide films formed from TEOS provide excellent step coverage, and undoped silicon dioxide films, also known as undoped silicon glass (USG) films, are used as poly-metal interlevel dielectric (PMD) materials in some integrated circuit fabrication processes. However, films formed of this material are disadvantageous in that they have relatively low polish rates and selectivity. This latter characteristic refers to the difference in etch rates between the silicon dioxide glass and an underlying silicon oxynitride etch stop layer as will be described in detail below. It is desirable for the silicon dioxide layer to etch much faster than the silicon oxynitride layer.

In addition, undoped silicon dioxide films cannot be reflowed as required by a number of processes. In order to add the reflow capability to these films, the material must be doped with phosphorous or boron. Phosphorous-doped silicon dioxide is also known as phosphorous-doped silicon glass (PSG). Phosphorous doping also produces a number of beneficial effects, including increased selectivity and a high polish rate which increases process throughput. Phosphorous doping also enhances gettering (the ability of crystalline defects to capture harmful impurities).

An exemplary semiconductor process which uses silicon dioxide glass is known in the art as "tungsten damascene". This process produces local interconnects which can be advantageously applied to semiconductor devices such as flash Electrically-Erasable Programmable Read-Only Memories (EEPROMs). The process includes forming an insulator layer of silicon dioxide glass over the memory cells, and then planarizing the insulator layer using chemical-mechanical polishing. Reactive Ion Etching (RIE) is then performed to form vertical interconnect holes through the glass down to interconnect areas (source, drain, etc.) of the cells. The holes are filled with tungsten which ohmically contacts the interconnect areas to form the local interconnects.

The silicon dioxide etch is conventionally performed using octafluorobutene ($C_4F_8$) etchant, which also has a high etch rate for silicon. For this reason, a mechanism must be provided for performing the silicon dioxide etch without allowing the etchant to act on the silicon of the underlying interconnect areas.

Such a mechanism includes forming a silicon oxynitride etch stop layer underneath the silicon dioxide layer, and performing the etch in two stages. The first stage is the octafluorobutene etch through the silicon dioxide layer, which terminates at the etch stop layer since octafluorobutene has a low etch rate for silicon oxynitride (selectivity as discussed above). Then, a second RIE etch is performed using fluoromethane ($CH_3F$), which forms holes through the portions of the etch stop layer that are exposed through the holes in the silicon dioxide layer, down to the interconnect areas of the devices. This is possible because fluoromethane has a high etch rate for silicon oxynitride, but a low etch rate for silicon dioxide.

The structure can be further facilitated by using a silicide technique to increase the conductivity of the interconnect areas of the cells. Siliciding is a fabrication technique that enables electrical interconnections to be made that have reduced resistance and capacitance.

The silicide process comprises forming a layer of a refractory metal silicide material such as tungsten, titanium, tantalum, molybdenum, etc. on a silicon interconnect area (source or drain diffusion region) or on a polysilicon gate to which ohmic contact is to be made, and then reacting the silicide material with the underlaying silicon material to form a silicide surface layer having much lower resistance than heavily doped silicon or polysilicon. A silicide surface layer formed on a polysilicon gate is called "polycide", whereas a silicide surface layer formed on silicon using a self-aligned process is called "salicide".

Phosphorous doping of TEOS based silicon dioxide dielectric layers or films is conventionally performed by the addition of trimethylphosphite (TMP). However, TMP is a liquid and must be vaporized in order to form a dielectric layer using PECVD. This additional step is not compatible with some PECVD deposition chambers. In addition, the vaporization step results in low uniformity and poor process control.

Another conventional dielectric material is formed by the deposition of silane ($SiH_4$) and phosphine ($PH_3$). However, this material is disadvantageous in that it provides poor step coverage.

SUMMARY OF THE INVENTION

The present invention provides a process for fabricating an improved microelectronic structure which overcomes the drawbacks of the prior art as described above. The present process produces a semiconductor structure including a substrate, a microelectronic device formed on the substrate, and a dielectric layer or film including silicon dioxide formed over the microelectronic device. The silicon dioxide layer is doped with phosphorous in the form of approximately 96% $SiO_2$ and 4% phosphorous ($P_2O_5$) by weight, and has high etch selectivity, polish rate and gettering capability as well as excellent step coverage. The present process also improves uniformity and process control because phosphine is a gas and does not have to be vaporized prior to deposition.

These and other features and advantages of the present invention will be apparent to those skilled in the art from the following detailed description, taken together with the accompanying drawings, in which like reference numerals refer to like parts.

DETAILED DESCRIPTION OF THE INVENTION

The present invention provides a process for forming an improved phosphorous-doped silicon dioxide dielectric film which can be used as a poly-metal interlevel dielectric (PMD), passivation layer, or other suitable microelectronic integrated circuit element. The invention will be described in the exemplary context of fabricating a semiconductor memory array. However, it will be understood that the present invention is not limited to this or any other particular application.

FIGS. 1 to 10 are simplified sectional diagrams illustrating a process for fabricating a portion of a flash Electrically-Erasable Programmable Read-Only Memory (EEPROM) according to the present invention. The detailed configuration of the memory is not the particular subject matter of the invention, and only those elements which are necessary for understanding the invention will be described and illustrated.

Figure 1:
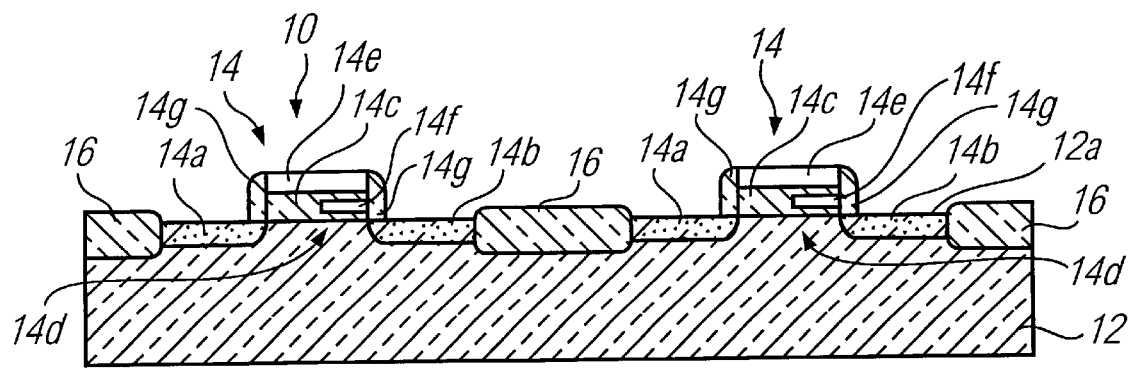
FIGS. 1 to 10 are simplified sectional views illustrating steps of a process for fabricating a semiconductor structure according to the present invention.

As viewed in FIG. 1, a flash EEPROM memory 10 includes a silicon semiconductor substrate 12. Two erasable memory cells 14 are formed on a surface 12a of the substrate 12, each including a Metal-Oxide-Semiconductor (MOS) transistor structure having a source 14a, drain 14b, gate oxide layer 14c, and channel 14d underlying the gate oxide layer 14c. The cells 14 are physically and electrically isolated from each other by field oxide regions 16.

A polysilicon control gate 14e is formed over each gate oxide layer 14c, and a polysilicon floating gate 14f is formed underneath the control gate 14e in the gate oxide layer 14c.

Although the gate oxide layers 14c are shown as being integral, they may comprise two or more sublayers. For example, portions of the gate oxide layers 14c which underlie the floating gates 14f may be separate tunnel oxide layers. Further shown in the drawing are electrically insulating gate sidewall spacers 14g.

The construction and operation of the memory 10 are not the particular subject matter of the invention and will not be described in detail. Furthermore, the reference numerals designating the individual elements of the memory cells will be omitted in FIGS. 2 to 10 except as required for understanding the invention to avoid cluttering of the drawings.

FIG. 1 illustrates the initial steps of the present process, which consist of providing the substrate 12, and forming semiconductor devices such as the erasable memory cells 14 on the surface 12a of the substrate 12.

Figure 2:
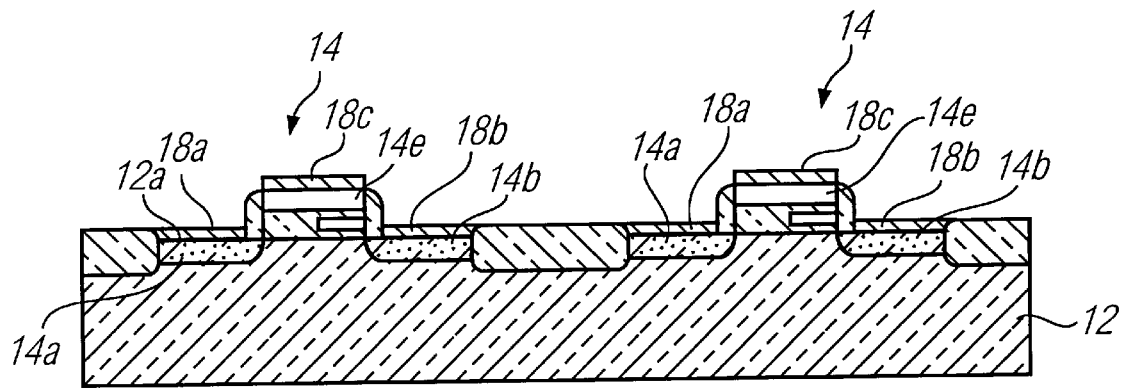

FIG. 2 shows how interconnect areas are formed for the elements of the cells using a silicide technique to increase the electrical conductivity. The process comprises forming a layer of a refractory metal silicide material such as tungsten, titanium, tantalum, molybdenum, etc. on the source, 14a, drain 14b, and control gate 14e to which ohmic contact is to be made, and then reacting the silicide material with the underlaying silicon material to form silicide source interconnect areas 18a, drain interconnect areas 18b, and control gate interconnect areas 18c respectively.

Figure 3:
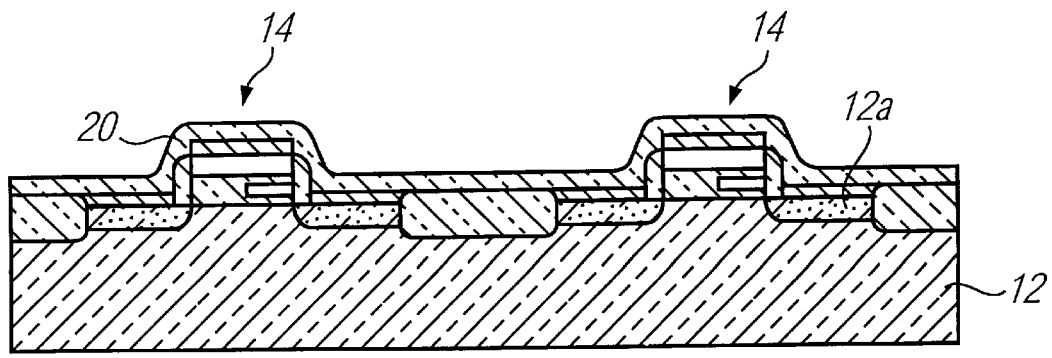

FIG. 3 illustrates how a silicon oxynitride (SiON:H) etch stop layer 20 is formed over the surface 12a of the substrate 12 and the cells 14 in accordance with the present invention. The "H" in the formula SiON:H indicates that the layer 20 includes a residual amount of hydrogen. The etch stop layer 20 is preferably formed using Plasma Enhanced Chemical Vapor Deposition (PECVD) to a thickness of approximately 800 Å.

Figure 4:
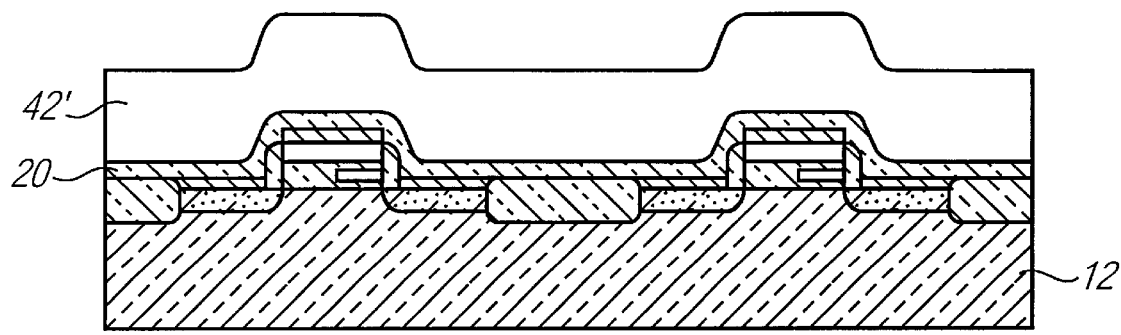
Figure 5:
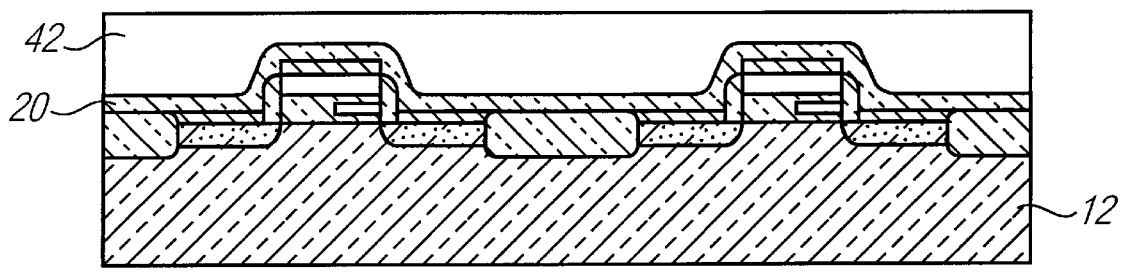

Referring now to FIG. 4, the next step of the process is to form an electrically insulating dielectric layer or film 42' of silicon dioxide ($SiO_2$) glass over the etch stop layer 20. The silicon dioxide layer 42' is planarized as illustrated in FIG. 5 using, preferably, chemical-mechanical polishing, and is redesignated as 42. In accordance with the present invention, a silicon dioxide film formed using the present process includes approximately 95% to 97%, preferably 96%, silicon dioxide and approximately 3% to 5%, preferably 4% phosphorous ($P_2O_5$), by weight.

Figure 11:
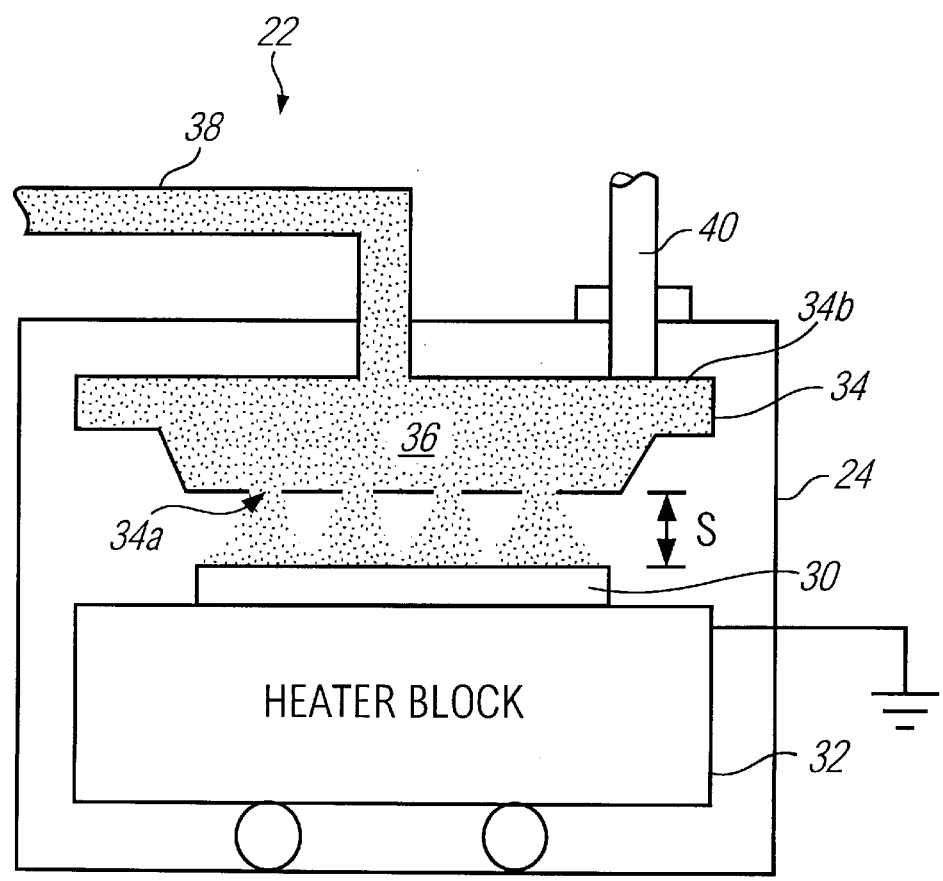
FIG. 11 is a simplified diagram illustrating a Plasma Enhanced Chemical Vapor Deposition (PECVD) apparatus for practicing the present invention.

A PECVD reaction chamber 22 for forming the etch stop layer 20 and the silicon dioxide layer 42' is illustrated in FIG. 11, and includes a container 24. A preferred chamber 22 is the Novellus Concept I System model which is commercially available from Novellus Systems, Inc. of San Jose, Calif. A silicon wafer 30 including one or more dies on which semiconductor structures such as the memories 10 as illustrated in FIG. 2 are formed is supported on a heater block 32.

To form the present silicon dioxide layer 42', the wafer 30 is heated to a temperature of approximately 400° C. by the heater block 32 which is electrically grounded and acts as a susceptor. A gas discharge nozzle which is known in the art as a shower head 34 is mounted in the container 24 above the wafer 30. A gas mixture 36 which is used to form the silicon dioxide layer 42' is fed into the shower head 34 through an inlet conduit 38 and discharged downwardly toward the wafer 30 through orifices 34a. The gas 36 includes tetra-ethylorthosilicate (TEOS), phosphine ($PH_3$) and nitrous oxide ($N_2O$).

Radio Frequency (RF) power is applied to the shower head 34 through a power lead 40. A blocker plate 34b is provided at the upper end of the shower head 34 to prevent gas from escaping upwardly.

The RF power applied to the shower head 34 creates an alternating electrical field between the shower head 34 and the grounded heater block 32 which forms a glow or plasma discharge in the gas 36 therebetween which enhances the deposition of the silicon dioxide layer or film 42'.

Conditions for the silicon dioxide deposition are listed below, including a preferred value for each parameter and an approximate range within which the parameter can be varied.

TEOS flow rate—2.3 ml/min (2 to 2.6)
Phosphine flow rate—250 sccm (200 to 300)
Nitrous oxide flow rate—13 slm (10 to 16)
Pressure—2.6 torr (2.0 to 3.2)
RF power—High frequency 400 w (250 to 550)
Low frequency 600 w (500 to 700)

Figure 6:
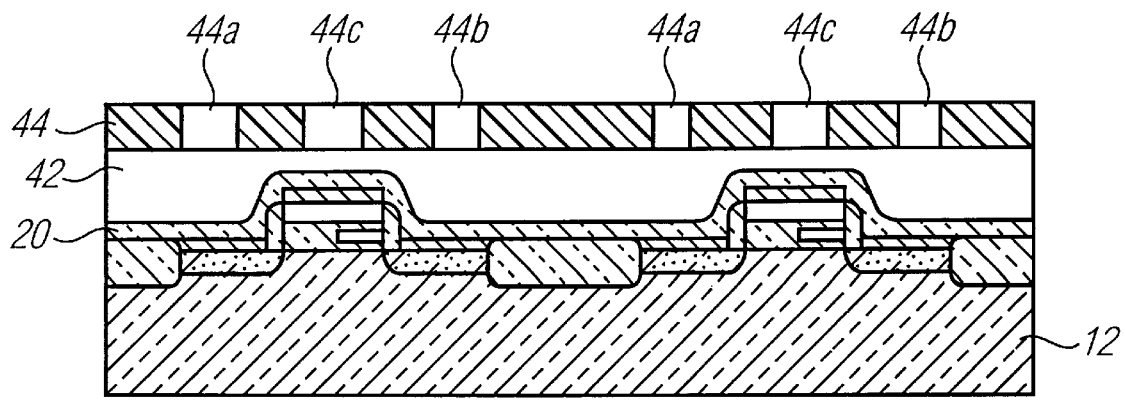
Figure 7:
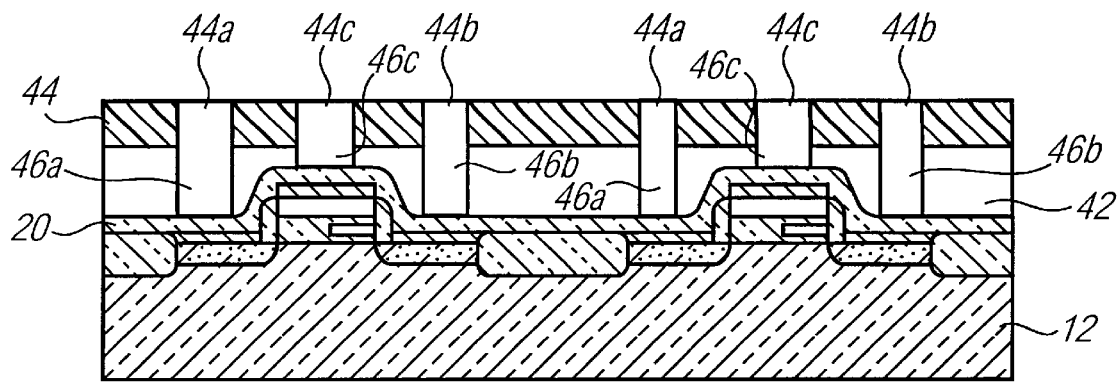
Figure 8:
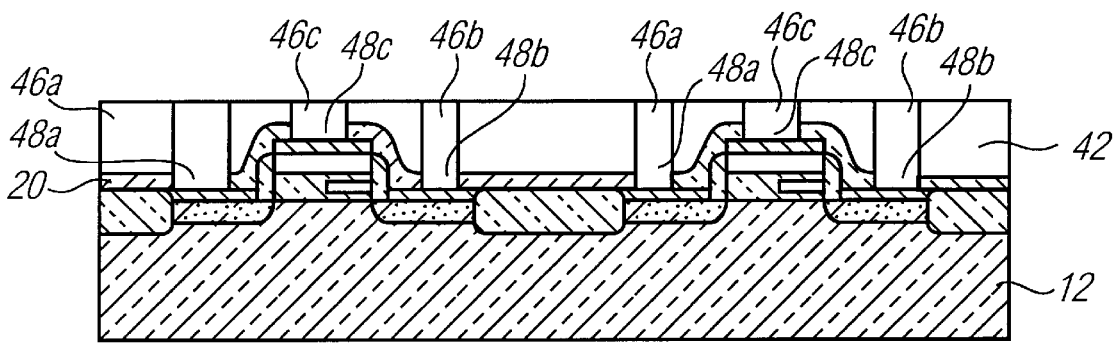

The remaining steps result in the formation of a tungsten damascene local interconnect structure for the memory 10. In FIG. 6, a layer of photoresist 44 is formed on the silicon dioxide layer 42, and patterned using photolithography such that holes 44a, 44b and 44c are formed above the silicide interconnect areas 18a, 18b and 18c respectively. In FIGS. 7 and 8, holes are etched through the silicon dioxide layer 42 and silicon oxynitride layer 20 down to the interconnect areas 18a, 18b and 18c, preferably using a two stage Reactive Ion Etching (RIE) process.

In FIG. 7, an RIE etch is performed using octafluorobutene ($C_4F_8$) which has a selectively high etch rate for silicon dioxide and a low etch rate for silicon oxynitride.

This results in the formation of vertical holes 46a, 46b and 46c which extend downwardly from the holes 44a, 44b and 44c of the photoresist layer 44 through the silicon dioxide layer 42 and stop on the silicon oxynitride etch stop layer 20 in alignment with the interconnect areas 18a, 18b and 18c respectively.

In FIG. 8, the photoresist layer 44 is stripped away, and a second RIE etch is performed using fluoromethane ($CH_3F$), which has a selectively high etch rate for silicon oxynitride and a low etch rate for silicon dioxide. This results in the formation of holes 48a, 48b and 48c through the silicon oxynitride layer 20. The holes 48a, 48b and 48c are extensions of the holes 46a, 46b and 46c through the silicon dioxide layer 42, and terminate at the interconnect areas 18a, 18b and 18c respectively.

Figure 9:
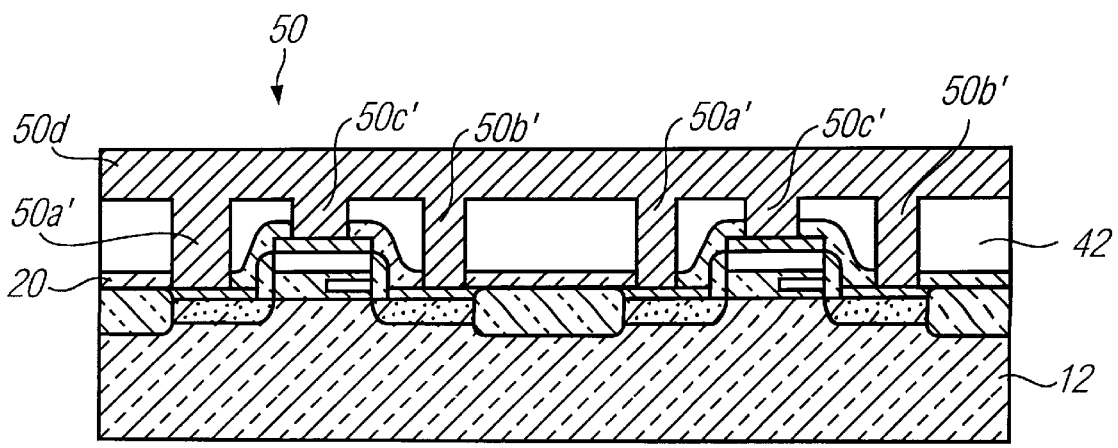

In FIG. 9, tungsten 50 is deposited over the structure of FIG. 8. The tungsten fills the holes through the silicon dioxide layer 42 and the silicon oxynitride layer 20 as indicated at 50a', 50b' and 50c', and ohmically contacts the interconnect areas 18a, 18b and 18c respectively. The tungsten further forms on the top of the silicon dioxide layer 42 as indicated at 50d.

Figure 10:
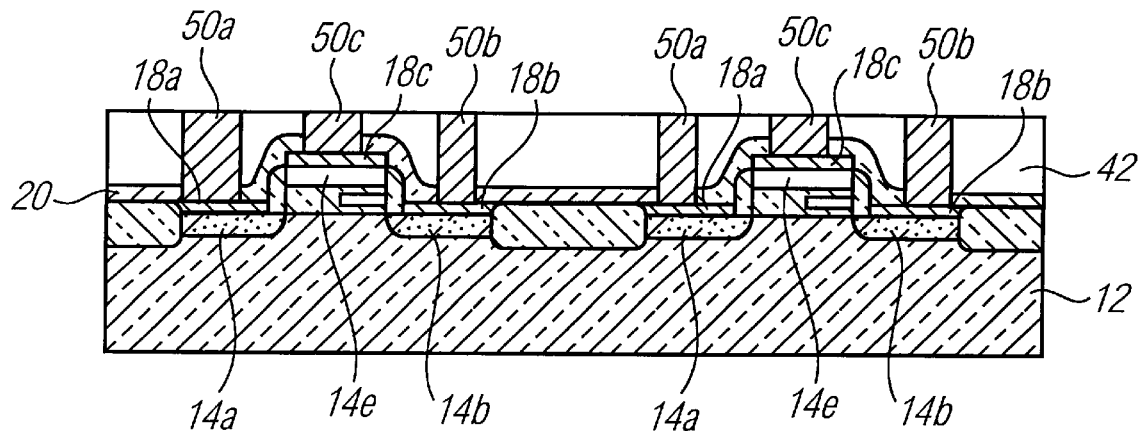

In FIG. 10, the top of the structure is planarized, preferably using chemical-mechanical polishing, to remove the tungsten 50d from the silicon dioxide layer 42. The result is independent local interconnects 50a, 50b and 50c which are formed of tungsten inlaid in the silicon dioxide layer 42 and the silicon oxynitride layer 20. The local interconnects 50a, 50b and 50c enable the sources 14a, drains 14b, and control gates 14e respectively of the transistors 14 to be electrically accessed from the upper surface of the structure.

In summary, the present invention overcomes the drawbacks of the prior art and provides a semiconductor structure including a silicon dioxide dielectric film with substantially improved etch selectivity, polish rate and gettering capability as well as excellent step coverage. The present process also improves uniformity and process control because phosphine is a gas and does not have to be vaporized prior to deposition.

Various modifications will become possible for those skilled in the art after receiving the teachings of the present disclosure without departing from the scope thereof.

I claim:

1. A semiconductor structure, comprising:

a substrate;

a microelectronic device formed on the substrate; and a dielectric layer including silicon dioxide ($SiO_2$) and phosphorous ($P_2O_5$) formed over the microelectronic device, in which:

the dielectric layer is formed using chemical vapor deposition by reacting tetraethylorthosilicate (TEOS) and phosphine ($PH_3$) over the microelectronic device.

2. A structure as in claim 1, in which the dielectric layer includes approximately 95% to 97% silicon dioxide and approximately 3% to 5% $P_2O_5$ by weight.

3. A structure as in claim 1, in which the dielectric layer includes approximately 96% silicon dioxide and approximately 4% $P_2O_5$ by weight.

4. A structure as in claim 1, in which the dielectric layer is formed by plasma enhanced chemical vapor deposition.

5. A dielectric film for a microelectronic circuit, comprising silicon dioxide ($SiO_2$) and phosphorous ($P_2O_5$), in which:

the film is formed using chemical vapor deposition by reacting tetraethylorthosilicate (TEOS) and phosphine ($PH_3$) over the microelectronic circuit.

6. A film as in claim 5, comprising:

approximately 95% to 97% silicon dioxide by weight; and approximately 3% to 5% $P_2O_5$ by weight.

7. A film as in claim 5, comprising:

approximately 96% silicon dioxide by weight; and approximately 4% $P_2O_5$ by weight.

8. A film as in claim 5 which is formed by plasma enhanced chemical vapor deposition.

9. A process for fabricating a semiconductor structure, comprising the steps of:

(a) providing a substrate;

(b) forming a microelectronic device on the substrate; and (c) forming a phosphorous-doped silicon dioxide ($SiO_2$) dielectric layer using chemical vapor deposition by reacting tetraethylorthosilicate (TEOS) and phosphine ($PH_3$) over the microelectronic device.

10. A process as in claim 9, in which step (c) comprises forming the dielectric layer to include approximately 95% to 97% silicon dioxide and approximately 3% to 5% phosphorous ($P_2O_5$) by weight.

11. A process as in claim 9, in which step (c) comprises forming the dielectric layer to include approximately 96% silicon dioxide and approximately 4% $P_2O_5$ by weight.

12. A process as in claim 11, in which step (c) comprises forming the dielectric layer with:

a TEOS flow rate of approximately 2 to 2.6 ml/min; and a phosphine flow rate of approximately 200 to 300 sccm.

13. A process as in claim 12, in which step (c) comprises forming the dielectric layer at a temperature of approximately 400° C.

14. A process as in claim 12, in which step (c) comprises forming the dielectric layer at a pressure of approximately 2.0 to 2.6 torr.

15. A process as in claim 12, in which step (c) comprises forming the dielectric layer with a nitrous oxide ($N_2O$) flow rate of approximately 10 to 16 slm.

16. A process as in claim 12, in which (c) comprises forming the dielectric layer using plasma enhanced chemical vapor deposition with application of radio frequency power.

* * * * *